United States Patent
Boday et al.

(10) Patent No.: US 8,614,155 B2
(45) Date of Patent: Dec. 24, 2013

(54) RESIN COMPOSITION ELIMINATING VOLATILE LOSS OF INITIATING SPECIES FOR THE PREPARATION OF PRINTED CIRCUIT BOARD LAMINATES

(75) Inventors: Dylan Joseph Boday, Tucson, AZ (US); Joseph Kuczynski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 12/860,117

(22) Filed: Aug. 20, 2010

(65) Prior Publication Data
US 2012/0045955 A1 Feb. 23, 2012

(51) Int. Cl.
*B32B 17/02* (2006.01)
*B32B 15/04* (2006.01)
*C08F 290/14* (2006.01)
*C08F 283/00* (2006.01)
*C08G 61/02* (2006.01)
*C08G 65/48* (2006.01)
*C08G 14/04* (2006.01)
*C08G 63/18* (2006.01)
*C08G 65/38* (2006.01)

(52) U.S. Cl.
USPC ............. 442/180; 428/457; 525/50; 525/390; 525/418; 525/534; 528/86; 528/148; 528/152; 528/154; 528/156; 528/193; 528/206

(58) Field of Classification Search
None
See application file for complete search history.

(56) References Cited

U.S. PATENT DOCUMENTS

| | | | |
|---|---|---|---|
| 5,218,030 A | 6/1993 | Katayose et al. | |
| 5,352,745 A | 10/1994 | Katayose et al. | |
| 6,352,782 B2 | 3/2002 | Yeager et al. | |
| 6,734,259 B1 | 5/2004 | Japp et al. | |

OTHER PUBLICATIONS

U.S. Appl. No. 12/718,213, to Boday et al., entitled "Hydrophobic Silane Coating for Preventing Conductive Anodic Filament (CAF) Growth in Printed Circuit Boards", filed Mar. 5, 2010, assigned to International Business Machines Corporation.

*Primary Examiner* — Jennifer Chriss
*Assistant Examiner* — Camie Thompson
(74) *Attorney, Agent, or Firm* — Matthew J. Bussan

(57) ABSTRACT

An enhanced prepreg for printed circuit board (PCB) laminates includes a substrate and a resin applied to the substrate. The resin includes a curable polymer and a polymerization initiator polymer having a backbone with a free radical initiator forming segment that breaks apart upon being subjected to heat to generate a plurality of non-volatile initiating species. This resin composition eliminates possible volatile loss of the free radical initiator during all processing steps in the preparation of PCB laminates. The resin may additionally include a cross-linking agent, flame retardant and viscosity modifiers. In one embodiment, a sheet of woven glass fibers is impregnated with the resin and subsequently dried or cured. The glass cloth substrate may include a silane coupling agent to couple the resin to the substrate. In another embodiment, resin coated copper (RCC) is prepared by applying the resin to copper and subsequently curing the resin.

15 Claims, 3 Drawing Sheets

RESIN COMPOSITION ELIMINATING VOLATILE LOSS OF INITIATING SPECIES FOR THE PREPARATION OF PRINTED CIRCUIT BOARD LAMINATES

BACKGROUND OF THE INVENTION

1. Field of Invention

The present invention relates in general to a composition of matter in which resins are polymerizable using non-volatile initiating species. More particularly, the present invention relates to compositions that are especially adapted for resin formulations (e.g., polyphenylene ether (PPE) and modified PPE resin formulations) used in printed circuit board laminates. These compositions are made into prepreg dielectric sheets or coated on a substrate and cured to form dielectric laminate structures for circuit packaging structures.

2. Background Art

One conventional technique for forming laminate circuit structures is to provide a sheet of what is referred to as prepreg, which is a glass cloth impregnated with a resin solution which subsequently is either dried or at least partially cured.

Also, a similar type of resin is sometimes used without glass cloth and coated onto metal, such as copper, for use as build up layers. These are commonly referred to as resin coated copper (RCC) or polymer coated copper (PCC). Such prepregs are then laminated with copper foils forming cores. Cores are then processed further, such as forming vias and circuitry thereon, and then laminated with additional prepregs and copper foils to form composite laminate structures.

The resin used to prepare these printed circuit board laminates typically includes a polymer, flame retardant, viscosity modifiers and an initiator. All of the components in the resin are non-volatile with the exception of the free radical initiator. Volatile loss of the initiator can occur during several of the steps in the preparation of the laminates (e.g., during resin preparation, during impregnation of the glass cloth, during coating of the copper, and/or during shipment, handling and curing of the prepreg). This volatile loss of the free radical initiator can cause significant changes to the physical properties of the laminate. Specifically, volatile loss of the initiator can change the degree of cross-linking in the laminate, thus changing the resultant mechanical properties. This can also lead to reproducibility problems as the laminate can outgas more or less of the initiator, depending on the environment to which it is subjected.

Particularly useful resins for forming prepregs are described in U.S. Pat. No. 6,352,782 B2, often referred to as PPE, assigned to General Electric Company, hereinafter sometimes referred to as the GE patent, and in U.S. Pat. No. 5,352,745, often referred to as modified PPE or APPE, assigned to Asahi Kasei Kogyo Kabushiki Kaisha of Tokyo, Japan, hereinafter sometimes referred to as the Asahi patent. Both of these patents are incorporated herein by reference in their entirety.

The PPE resin as described in the GE patent is a reactively end capped poly(phenylene ether) compound cured with certain unsaturated compounds for synthesizing resins ideally adapted for impregnating fibrous reinforcement in the manufacture of circuit boards.

The modified PPE as described in the Asahi patent is a curable polyphenylene ether resin composition comprising a reaction product obtained by reacting a polyphenylene ether with an unsaturated carboxylic acid or an acid anhydride and at least one cyanurate. Generally speaking, these compositions include about 98% to about 40% by weight of a curable polyphenylene ether resin comprising a reaction product obtained by reacting a polyphenylene ether with an unsaturated carboxylic acid or an acid anhydride, and 2% to 60% by weight, based on the total weight of this and the previous components, of at least one cyanurate selected from the group consisting of triallyl isocyanurate (TAIC) and triallyl cyanurate. These compositions include an initiator. Generally speaking, the initiator is a peroxide of a low molecular weight compound, i.e., below about 700 grams per mole. These peroxides are described in the Asahi patent at column 13, lines 10-23, and in the GE patent at column 12, lines 19-28.

An earlier PPE composition is described in U.S. Pat. No. 5,218,030, assigned to Asahi Kasei Kogyo Kabushiki Kaisha of Tokyo, Japan. It describes the use of poly(phenylene ether) containing pendant allyl or propargyl groups, triallylcyanurate or triallylisocyanurate, and optionally an antimony-containing flame retardant. Other formulations replace this antimony flame retardant with bromine containing compounds.

Several problems have been encountered when using the PPE or modified PPE compositions incorporating low molecular weight initiators. (Hereinafter, the term PPE may be used for both PPE and modified PPE.) First, one problem is that the prepreg has component volatility characterized by the volatilization of the low molecular weight peroxide initiators. Second, following lamination, there is a marked outgassing which has been attributed to the breakdown components of the low molecular weight initiator that do not enter into the reaction and are trapped in the matrix and outgas upon lamination. Third, the inability to laminate the material after the prepreg has been exposed to wet processing. It is believed that this is due to the fact that the low molecular weight initiator is driven off when the prepreg is heated to remove any absorbed water. The first and third of these conditions result in poor crosslinking and, thus, degraded material and final structure properties. The second of these conditions results in the propensity to delamination of the cured prepreg layers. The need to solve these problems to improve the commercial viability of the currently available PPE and APPE products was recognized in U.S. Pat. No. 6,734,259 B1, assigned to International Business Machines Corporation, hereinafter sometimes referred to as the IBM patent. The IBM patent, which is described below, is incorporated herein by reference in its entirety.

The prepreg resin described in the IBM patent includes a polymerization initiator comprised of a peroxide functionalized polymer that is fragmented by heat to a plurality of free radical moieties, and a relatively inert moiety having a molecular weight greater than about 1000. The high molecular weight polyperoxide material provided as an initiator is described in the IBM patent at column 4, line 27-column 5, line 34. According to the IBM patent, the polyperoxide is preferably a peroxidized polystyrene. The IBM patent depicts a general structure of a peroxide functionalized polymer that can be used. A polymer in the general structure depicted can be functionalized to incorporate peroxide groups in pendant side chains or at the end groups. In other respects, the prepreg resin described in the IBM patent is like those described in the GE patent and the Asahi patent. These compositions include about 98% to about 40% by weight of a curable polyphenylene ether resin, and 2% to 60% by weight, based on the total weight of this and the previous component, of triallyl isocyanurate. A bromated flame retardant is also typically included in these compositions.

Several problems have been encountered when using the PPE or modified PPE compositions incorporating the high molecular weight polyperoxide material described in the IBM patent as a polymerization initiator. First, one problem is that the physical properties of the prepreg (e.g., glass transition temperature $T_g$, mechanical properties, etc.) may change because the free-radical initiators are bound to the polymer as pendant functional groups (rather than being bound in the backbone of the polymer). Second, upon heating to cure the prepreg, the free radical initiators bound to the polymer prior to heating are degraded to generate only one initiating species (along with the relatively inert moiety). A plurality of free radical moieties are generated only if prior to heating the free-radical initiators are bound to the polymer as a plurality of pendant functional groups. Third, the generated initiating species is not bound to the polymer and, thus, is volatile. The generated initiating species (i.e., a number of t-butoxide moieties which will react with the TAIC to promote crosslinking) has a boiling point of 85° C., while the temperatures used to cure the prepreg typically exceed approximately 130° C. Because the generated initiating species is volatile, its effectiveness as an initiator is significantly reduced and the physical properties of the resulting material may change uncontrollably from batch to batch.

These problems are also encountered when the polymerization initiator described in the IBM patent is incorporated in other resin compositions (i.e., resin compositions other than PPE and modified PPE compositions). The PCB industry has recently migrated away from the traditional FR4 epoxy based resins (due to lead-free requirements and the higher soldering temperatures associated with tin-silver-copper alloys). Hence, current resin coatings are typically no longer comprised of FR4 epoxies, rather they are more likely to be bismaleimide triazine (BT) resins or polyphenylene oxide/triallyl-isocyanurate (PPO/TAIC) interpenetrating networks. Incorporating the high molecular weight polyperoxide material described in the IBM patent as a polymerization initiator into such other resin compositions introduces the same problems noted above.

Therefore, a need exists for these problems to be solved to improve the commercial viability of the currently available PPE and APPE products, as well as enhance the performance of other resin compositions that are used in printed circuit board laminates.

SUMMARY OF THE INVENTION

According to the preferred embodiments of the present invention, an enhanced prepreg for printed circuit board (PCB) laminates includes a substrate and a resin applied to the substrate. The resin includes a curable polymer and a polymerization initiator polymer having a backbone with a free radical initiator forming segment that breaks apart upon being subjected to heat to generate a plurality of non-volatile initiating species. This resin composition eliminates possible volatile loss of the free radical initiator during all processing steps in the preparation of PCB laminates. The resin may additionally include a cross-linking agent, flame retardant and viscosity modifiers. In one embodiment, a sheet of woven glass fibers is impregnated with the resin and subsequently dried or cured. The glass cloth substrate may include a silane coupling agent to couple the resin to the substrate. In another embodiment, resin coated copper (RCC) is prepared by applying the resin to copper and subsequently curing the resin.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

Figure 1:
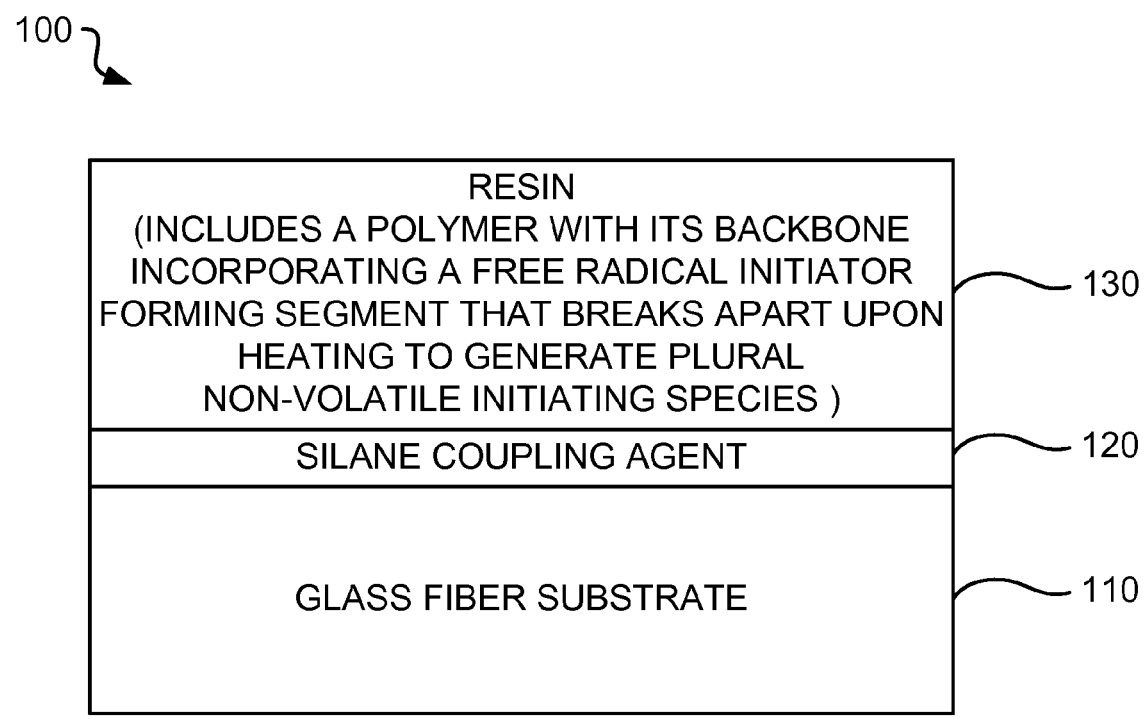
FIG. 1 is a block diagram illustrating a portion of a printed circuit board (PCB) laminate in which a resin in accordance with the preferred embodiments of the present invention is applied to a glass fiber substrate coated with a silane coupling agent.

In accordance with the preferred embodiments of the present invention, an enhanced prepreg for printed circuit board (PCB) laminates includes a substrate and a resin applied to the substrate. The resin includes a curable polymer and a polymerization initiator polymer having a backbone with a free radical initiator forming segment that breaks apart upon being subjected to heat to generate a plurality of non-volatile initiating species. This resin composition eliminates possible volatile loss of the free radical initiator during all processing steps in the preparation of PCB laminates. The resin may additionally include a cross-linking agent, flame retardant and viscosity modifiers. In one embodiment, a sheet of woven glass fibers is impregnated with the resin and subsequently dried or cured. The glass cloth substrate may include a silane coupling agent to couple the resin to the substrate. In another embodiment, resin coated copper (RCC) is prepared by applying the resin to copper and subsequently curing the resin.

2. Detailed Description

A goal of the present invention is to provide a resin formulation that eliminates the volatile loss of the initiator during all steps in the preparation of the laminates. Another goal of the present invention is to provide a resin formulation that will allow for simpler and more efficient processing and handling of laminates and improve the reproducibility of their preparation.

In accordance with the preferred embodiments of the present invention, a polymer having a backbone with a free radical initiator forming segment that breaks apart upon being subjected to heat to generate a plurality of non-volatile initiating species is provided as a polymerization initiator in a curable resin composition. In addition to this polymer, the curable resin composition may, for example, include a curable polymer such as a curable polyphenylene ether (PPE) and at least one cyanurate selected from the group consisting of triallyl isocyanurate and triallyl cyanurate as a cross-linking agent. One skilled in the art will appreciate that the curable resin composition may alternatively include other conventional curable polymers and/or cross-linking agents such as those used in polyphenylene oxide/triallyl-isocyanurate (PPO/TAIC) interpenetrating networks. The polymerization initiator polymer in the curable resin composition preferably has a molecular weight in excess of 2000 and more preferably in excess of 3000 Likewise, each of the non-volatile initiating species generated by this polymer when it breaks apart upon being subjected to heat preferably has a molecular weight in excess of 1000 and more preferably in excess of 3000. Three exemplary polymers that are particularly useful for use as the polymerization initiator in the curable resin composition are represented below as "Polymer A", "Polymer B", and "Polymer C", along with the decomposition products thereof.

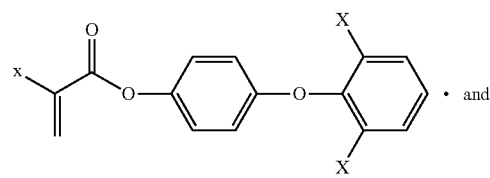

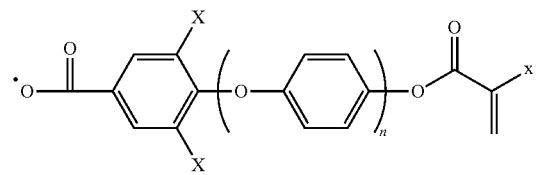

wherein X is a hydrogen atom or methyl group, and wherein x is a hydrogen atom or methyl group.

Polymer A

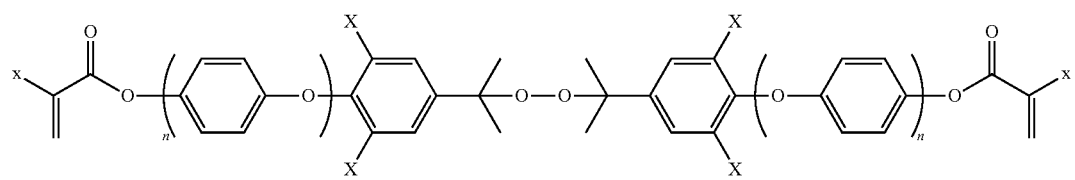

wherein the non-volatile initiating species generated by Polymer A are

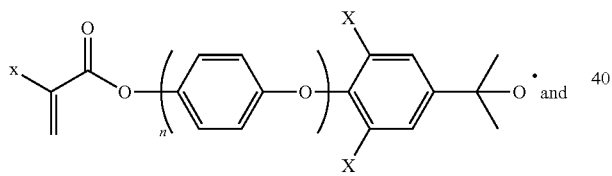

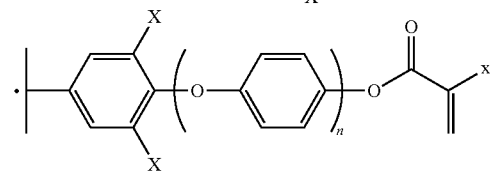

wherein X is a hydrogen atom or methyl group, and wherein x is a hydrogen atom or methyl group.

Polymer B

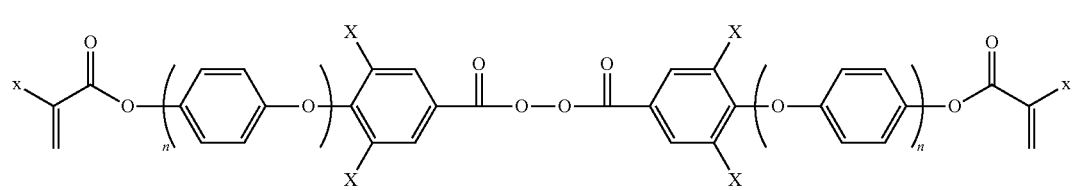

wherein the non-volatile initiating species generated by Polymer B are

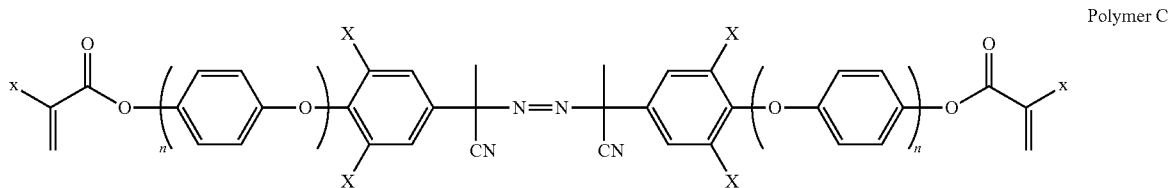

Polymer C wherein the non-volatile initiating species generated by Polymer C are

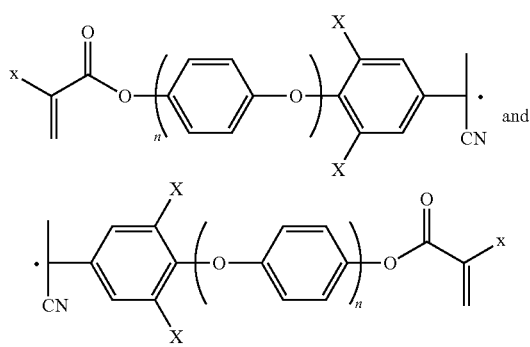

and wherein X is a hydrogen atom or methyl group, and wherein x is a hydrogen atom or methyl group. One skilled in the art will appreciate that many other high molecular weight polymers having a backbone with a free radical initiator forming segment that breaks apart upon being subjected to heat to generate a plurality of non-volatile initiating species are possible. In general, to be suitable as the polymerization initiator such other polymers preferably would also be thermally stable and relatively hydrophobic in nature, as well as exhibit reasonably low dielectric properties.

Each of the above three exemplary polymers (i.e., Polymer A, Polymer B and Polymer C) preferably has a molecular weight in excess of 2000 and more preferably in excess of 3000. Conventional processing conditions include evaporating the solvent at between about 50° C. and 120° C., and then curing at about 200° C. for about two hours, at about 200 PSI to about 1000 PSI. One skilled in the art will appreciate that these are just some of the conditions that can be used to cure the resin. Many other conditions are possible.

Under heat, each of the above three exemplary polymers (i.e., Polymer A, Polymer B and Polymer C) breaks apart to generate the non-volatile initiating species shown above. Each of these non-volatile species preferably has a molecular weight in excess of 1000 and more preferably in excess of 3000. These non-volatile species will react with the TAIC to promote cross-linking. Moreover, these non-volatile species also should not interfere with the electrical or mechanical properties of the cured resin, i.e., the properties of the cured resin should not differ significantly from those described in the Asahi and GE patents. Thus, each of the above three exemplary polymers will not be subject to any significant evaporation from the PPE composition, nor will it evaporate to any significant extent if the composition is exposed to water and the water is subsequently dried; moreover, under heat, each of the non-volatile initiating species will not volatilize because of its high molecular weight. Thus, by using a high molecular weight polymer having a backbone with a free radical initiator forming segment that breaks apart upon being subjected to heat to generate a plurality of non-volatile initiating species, the three major problems encountered with the PPE resin system in the Asahi and GE patents have been overcome.

In addition, by using a high molecular weight polymer having a backbone with a free radical initiator forming segment that breaks apart upon being subjected to heat to generate a plurality of non-volatile initiating species, the three major problems encountered with the PPE resin system in the IBM patent (which uses a high molecular weight polyperoxide initiator functionalized to incorporate peroxide groups in pendant side chains or at the end groups) are overcome. First, the physical properties of the prepreg (e.g., glass transition temperature $T_g$, mechanical properties, etc.) do not change because the free-radical initiators are bound in the backbone of the polymer (rather than being bound as pendent functional groups). Second, a plurality of non-volatile initiating species are generated when the free radical initiator forming segment of the polymer backbone breaks apart upon being subjected to heat. This reduces the concentration of initiating species required to cure the prepreg. Third, each of the non-volatile initiating species generated will not volatilize because of its high molecular weight. With both initiating species not being volatile, the physical properties of the laminate are highly reproducible from batch to batch.

To summarize, although the polymerization initiator described in the IBM patent does provide a non-volatile prepreg during shipment, that initiator has several drawbacks. The most significant drawback is that once the free radical species is generated, it becomes volatile. This leads to highly un-reproducible material properties. Additionally, higher concentration of initiating species is required. The physical properties of the resulting polymer change as well.

The resin composition in accordance with the preferred embodiments of the present invention has several advantages over the polymerization initiator described in the IBM patent: the resin composition in accordance with the preferred embodiments of the present invention reduces the required initiator concentration; the physical properties of the resulting polymer do not change; and, most importantly, at no point in the entire process does the resin composition contain any volatile components. This leads to a highly reproducible process. This reproducibility, in turn, allows for simplification of and improved efficiency in processing and handling during preparation of the laminates. Also, the resin composition allows for safer processing and handling because the initiating species is no longer a volatile organic compound.

A polymer with a free radical initiator forming segment built into its backbone in accordance with the present invention (also referred to herein as a "polymerization initiator polymer") can be solely used in the preparation of laminate or can be incorporated as a blend with other conventional polymers used in laminate production. For example, a polymerization initiator polymer in accordance with the present invention (e.g., Polymer A) can be used alone in the preparation of laminate or, alternatively, that same polymerization initiator polymer can be blended with other conventional polymers used in laminate production (e.g., polyphenylene oxide/triallyl-isocyanurate (PPO/TAIC) interpenetrating networks).

Ideally, it is preferable to use the minimum amount of the polymerization initiator polymer required to ensure complete and efficient curing of the laminate. Typically, the concentration of the conventional initiator used in laminate preparation is less than 1 wt %. The polymerization initiator polymer in accordance with the preferred embodiment of the present invention is typically blended with PPO or other conventional polymers used in laminate production at comparable (or lower) levels of concentration. In this fashion, any change to the base resin will be minimized because the polymerization initiator polymer is present in the formulation at comparably low levels. Typically, the polymerization initiator polymer will have the exact physical properties of the base resin (e.g., Polymer A has the exact physical properties of PPO, as does Polymer B and Polymer C). Once the polymerization initiator polymer and the base resin are combined with the viscosity modifiers and flame retardant, the resulting resin composition may be pressed into a glass cloth, for example. Upon heating the prepreg, the polymerization initiator polymer degrades to form two non-volatile radical initiating species, thus curing the polymer. Using the polymerization initiator polymer eliminates possible volatile loss of the free radical initiator during all processing steps in the preparation of laminates.

An example of an approach for synthesizing Polymer A is represented below as "Exemplary Synthesis of Polymer A". In general, a polymerization initiator polymer in accordance with the present invention can be synthesized in any number of ways or may be obtained as a commercially available polymer. The present invention relates to the use of such a polymer (i.e., a polymer having a free radical initiator forming segment built into its backbone that breaks apart upon being subjected to heat to generate two non-volatile initiating species) as a polymerization initiator regardless of the synthetic approach used for its preparation.

Exemplary Synthesis of Polymer A

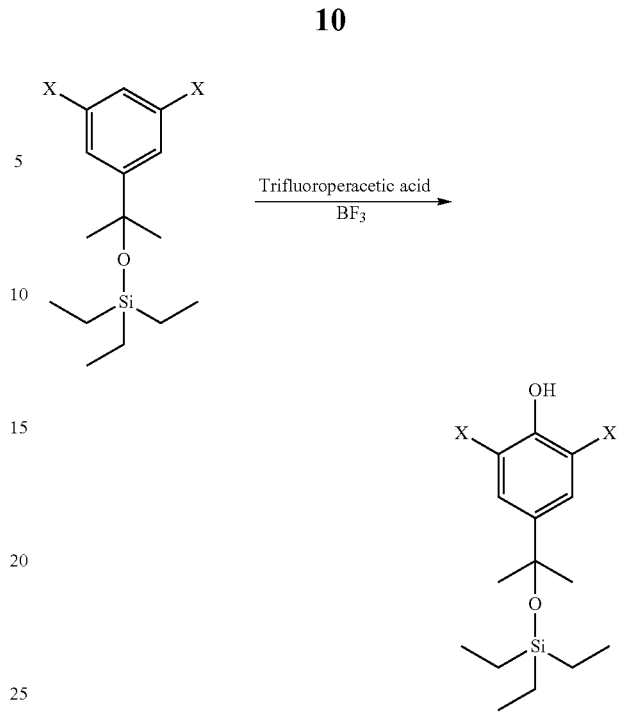

wherein X is a hydrogen atom or methyl group.

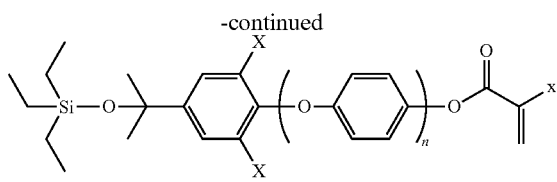

wherein X is a hydrogen atom or methyl group, and x is a hydrogen atom or methyl group.

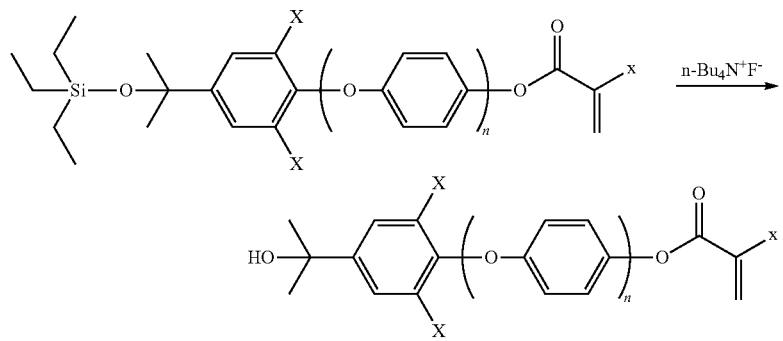

wherein X is a hydrogen atom or methyl group, and x is a hydrogen atom or methyl group.

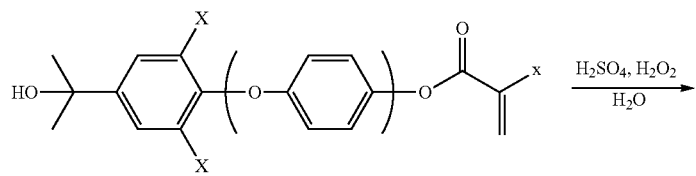

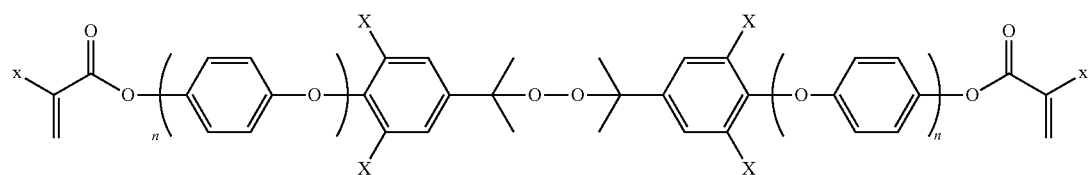

wherein X is a hydrogen atom or methyl group, and x is a hydrogen atom or methyl group.

In an exemplary embodiment of the present invention, there is (a) 98% to 40% by weight based on the total weight of components (a) and (b) of a curable polyphenylene ether (PPE) resin, preferably comprising a reaction product obtained by reacting a polyphenylene ether with an unsaturated carboxylic acid or an acid anhydride; and (b) 2% to 60% by weight based on the total weight of components (a) and (b) of at least one cyanurate selected from the group consisting of triallyl isocyanurate and triallyl cyanurate. Other components may optionally be added as described in the Asahi and GE patents, such as an epoxy resin and a curing agent, to which the polymerization initiator polymer in accordance with the present invention is added. Preferably the polymerization initiator polymer is added from about 0.1 to about 10 parts by weight and, more preferably, from 0.1 to 8 parts by weight based on 100 parts by weight of the components (a) and (b). These compositions may also contain filler materials, such as silica. The polymerization initiator polymer is a high molecular weight (preferably in excess of 2000 and, more preferably, in excess of 3000) polymer having a backbone with a free radical initiator forming segment that breaks apart upon being subjected to heat to generate a plurality of non-volatile initiating species (each having a molecular weight preferably in excess of 1000 and, more preferably, in excess of 3000). The polymerization initiator polymer may be, for example, one or more of the above three exemplary polymers (i.e., Polymer A, Polymer B and/or Polymer C).

The particular resin and initiators described herein can be either manufactured into prepreg (shown in FIG. 1, described below) or resin coated copper (shown in FIG. 2, described below) with improved storage and handling behavior. These materials are then processed in a conventional manner resulting in low dielectric, highly stable, hydrophobic laminated electronic packaging structures (e.g., printed circuit boards and laminate chip carriers) that do not suffer from out-gassing during the curing and later heating stages. Significantly, each of the non-volatile initiating species generated when the free radical initiator forming segment of the polymer backbone breaks apart upon being subjected to heat will not volatilize because of its high molecular weight.

FIG. 1 is a block diagram illustrating a portion of a printed circuit board (PCB) laminate 100 in which a resin 130 in accordance with the preferred embodiments of the present invention is applied to a glass fiber substrate 110 having its surface modified by a silane coupling agent 120.

Typically, a silane coupling agent is applied to the surface of a glass fiber substrate. In addition, an optional silane composition may be applied to the surface of the glass fiber substrate (to which the silane coupling agent was earlier applied) to form a hydrophobic silane coating, which is an intermixed layer containing both silanes. Such a hydrophobic silane coating for preventing conductive anode filament (CAF) is disclosed in U.S. patent application Ser. No. 12/718,213, assigned to International Business Machines Corporation, which is hereby incorporated herein by reference in its entirety.

The resin 130 may be any conventional base resin that is modified in accordance with the preferred embodiments of the present invention to include a polymerization initiator polymer having a backbone with a free radical initiator forming segment that breaks apart upon being subjected to heat to generate a plurality of non-volatile initiating species. For example, the resin 130 may a polyphenylene ether (PPE) resin, a modified PPE (APPE) resin, an FR4 epoxy resin, a bismaleimide triazine (BT) resin, or a polyphenylene oxide/triallyl-isocyanurate (PPO/TAIC) interpenetrating network, each modified to include one or more of the above three exemplary polymers (i.e., Polymer A, Polymer B and/or Polymer C) as the polymerization initiator.

The substrate 110 is conventional and may be any suitable substrate. For example, the substrate 110 may be woven glass cloth.

The silane coupling agent 120 is conventional and may be any suitable silane coupling agent. The silane coupling agent typically consists of an organofunctional group to bind to the resin coating 130 and a hydrolyzable group that binds to the surface of the substrate 110. For example, the silane coupling agent may be vinylbenzylaminoethylaminopropyltrimethoxysilane or diallylpropylisocyanurate-trimethoxysilane. Typically, the silane coupling agent is a monolayer thick.

The optional silane composition used to form the hydrophobic silane coating (an intermixed layer containing both silanes) typically includes a silane having a general formula structure $R_1$—Si—$R_{(2-4)}$, wherein $R_1$ is a functional group that is reactive with alcohols, water and/or surface silanols, and wherein $R_2$, $R_3$ and $R_4$ are each a functional group that is hydrophobic and non-reactive (i.e., $R_2$, $R_3$ and $R_4$ are each non-reactive with the alcohols, water and/or surface silanols with which $R_1$ is reactive). Examples of suitable silanes for the silane composition include (without limitation) chlorotrimethylsilane (i.e., $(CH_3)_3SiCl$, also known as trimethylsilylchloride or TMSCl), hexamethyldisilazane (i.e., $[(CH_3)_3Si]_2NH$, also known as HMDS or HMDZ), perfluorooctyl-1H,1H,2H,2H-dimethylchlorosilane (i.e., $C_{10}H_{10}ClF_{13}Si$), and (3,3,3-trifluoropropyl)dimethyl-chlorosilane (i.e., $C_5H_{10}ClF_3Si$); and combinations thereof.

Figure 2:
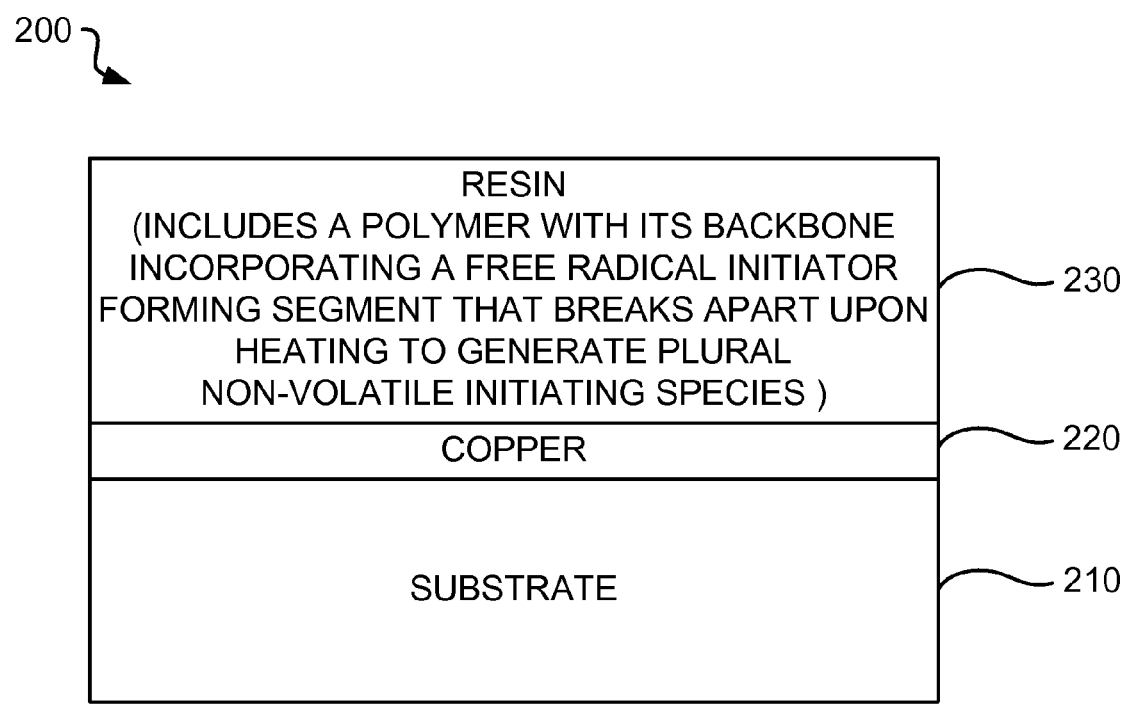
FIG. 2 is a block diagram illustrating a portion of a printed circuit board (PCB) laminate in which resin coated copper (RCC) is prepared by applying to copper a resin in accordance with the preferred embodiments of the present invention.

FIG. 2 is a block diagram illustrating a portion of a printed circuit board (PCB) laminate 200 in which resin coated copper (RCC) is prepared by applying to copper 220 a resin 230 in accordance with the preferred embodiments of the present invention.

The resin 230 may be any conventional resin that is modified in accordance with the preferred embodiments of the present invention to include a polymerization initiator polymer having a backbone with a free radical initiator forming segment that breaks apart upon being subjected to heat to generate a plurality of non-volatile initiating species. For example, the resin 130 may a polyphenylene ether (PPE) resin, a modified PPE (APPE) resin, an FR4 epoxy resin, a bismaleimide triazine (BT) resin, or a polyphenylene oxide/triallyl-isocyanurate (PPO/TAIC) interpenetrating network, each modified to include one or more of the above three exemplary polymers (i.e., Polymer A, Polymer B and/or Polymer C) as the polymerization initiator.

The substrate 210 is conventional and may be any suitable substrate. For example, the substrate 210 may be an organic or inorganic substrate having a layer of copper 220 provided on the surface thereof.

The layer of copper 220 is conventional and may be any suitable copper film, coating, foil or the like. The layer of copper 220 may be, for example, a copper coating deposited onto the surface of the substrate 210 utilizing any suitable conventional process. Alternatively, any suitable metal may be used in lieu of the layer of copper 220.

Figure 3:
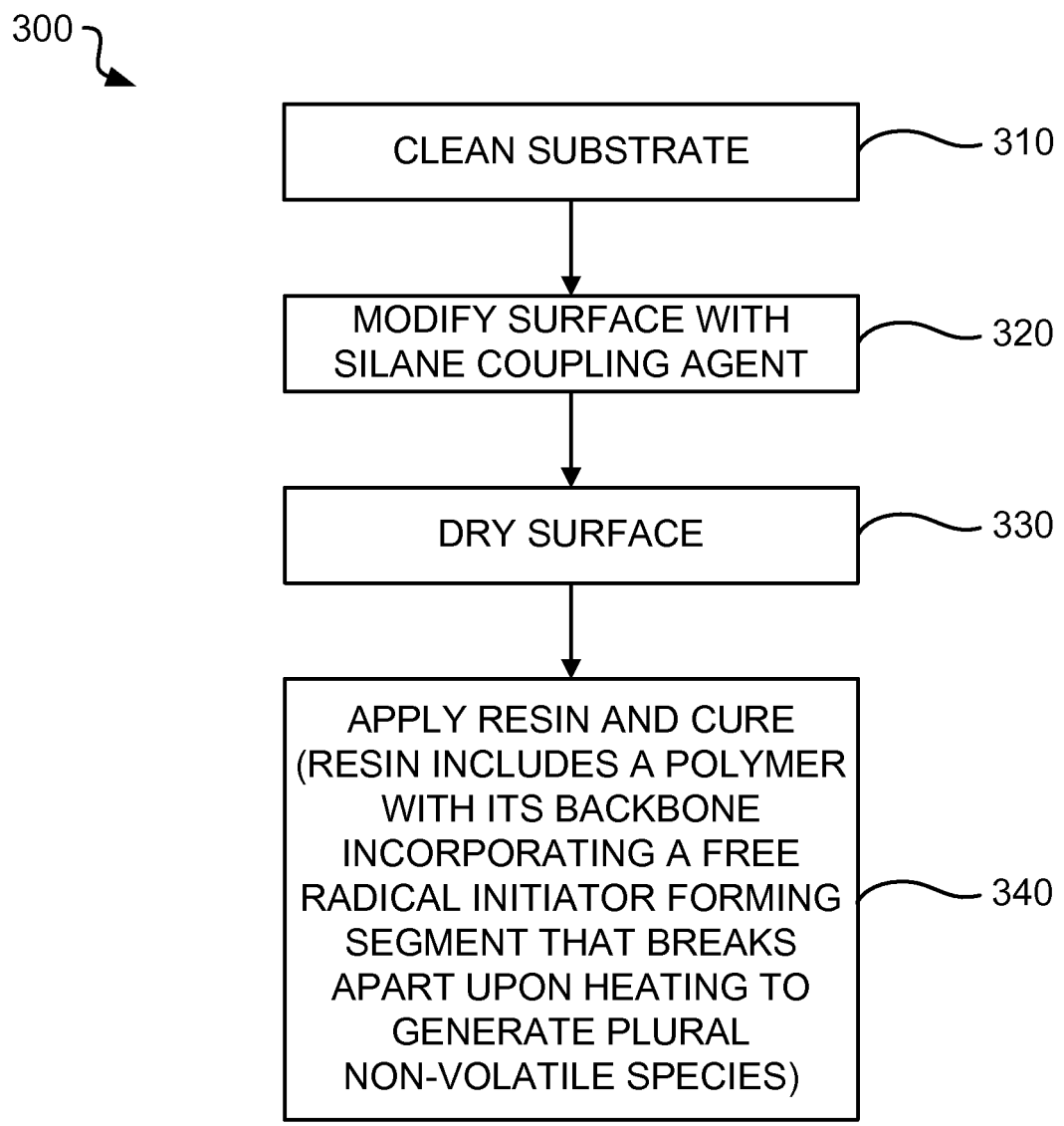
FIG. 3 is a flow diagram illustrating a method of making the printed circuit board (PCB) laminate shown in FIG. 1 in accordance with the preferred embodiments of the present invention.

FIG. 3 is a flow diagram illustrating a method 300 of making the printed circuit board (PCB) laminate 100 (shown in FIG. 1) in accordance with the preferred embodiments of the present invention. In the method 300, the steps discussed below (steps 310-340) are performed. These steps are set forth in their preferred order. It must be understood, however, that the various steps may occur at different times relative to one another than shown, or may occur simultaneously. Moreover, those skilled in the art will appreciate that one or more of the steps may be omitted.

Method 300 begins when a substrate that includes glass fiber is cleaned (step 310). The substrate is conventional and may be any suitable substrate that includes glass fiber. For example, the substrate may be woven glass cloth. The substrate is cleaned utilizing any suitable conventional cleaning process, such as the industry standard process for cleaning woven glass fabric described below.

Glass fiber is typically received at the glass weaver on a bobbin and contains a sizing agent typically present at approximately 1.5 wt % of the glass filament. The sizing agent is a starch and oil-based formulation that serves as an anti-static and slip agent which imparts strength to the fabric during the weaving process. The glass filament to be woven in the machine direction may contain 1 wt % PVA to impart additional mechanical strength during the warping process. Following weaving, the fabric is cleaned via an industry standard process:

1) The fabric is wound on a mandrel and subjected to temperatures in excess of 500 C for several hours (a process known to those skilled in the art as "carmelizing" as the fabric takes on a golden brown color).

2) Mandrels are subsequently subjected to temperatures greater than 200 C for several days (in order to permit the temperature in the center of the core to equilibrate with the temperature of the fabric surface).

3) The fabric is permitted to cool to ambient temperature overnight.

The method 300 continues with modification of the surface of the substrate with a silane coupling agent (step 320). The silane coupling agent is conventional and may be any suitable silane coupling agent. For example, the silane coupling agent may be vinylbenzylaminoethylaminopropyltrimethoxysilane or diallylpropylisocyanurate-trimethoxysilane. The silane coupling agent is applied to the surface of the substrate using any suitable conventional surface modification process.

Steps 310 and 320 may be omitted in favor of obtaining a conventional glass fiber substrate having its surface already modified with a silane coupling agent. Such surface modified glass fiber substrates are commercially available from glass weavers. The surface modification processes utilized by these glass weavers may include elements that are considered proprietary to the glass weaver.

Typical process parameters of conventional surface modification processes include the addition of a surfactant to a silane bath (i.e., typically, the glass fabric is dipped in a silane bath) to enhance wetting of the glass fabric as well as prevent foaming. The silane coupling agent concentration in the silane bath may be as high as 1 wt %, for example, though it is typically much less. The silane bath is typically acidic (pH 3-5) to prevent self-condensation of the silane.

In one exemplary conventional surface modification process, the glass fabric may be dipped into 0.1%-0.5% silane coupling agent/water solution (or water-ethanol solution), and then air-dried. The glass fabric may then be placed in a desiccator at 110-120 C for 5-10 minutes to cure the silane coupling agent on the surface of the substrate.

In another conventional surface modification process, an alcohol solution is used for silylating the surface of the substrate with a silane coupling agent. A 2% silane solution can be prepared in a suitable alcohol (e.g., methanol, ethanol, isopropanol, and the like). The surface of the substrate can be wiped, dipped, or sprayed with this solution. If the substrate is dipped into the solution, a sufficient submersion time (e.g., one or two minutes) may be necessary to allow silane migration to the surface of the substrate. The substrate is then dried (e.g., air-dried). After the surface of the substrate dries, excess material can be gently wiped, or briefly rinsed off with alcohol. The layer of silane coupling agent may then be cured on the surface of the substrate for 5-10 minutes at 110 C, or for 24 hours at ambient temperature.

The method 300 may continue with the drying of the surface of the substrate (i.e., the treated glass fabric) dried using any suitable conventional methodology known to those skilled in the art (step 330). For example, the treated glass fabric may be dried at 110-120 C for 5-10 minutes. However, step 330 may be at least partially performed as part of step 320, discussed above, when the silane coupling agent is cured on the surface of the substrate.

The coated substrate (i.e., silane coupling coating/substrate) may then be further processed using a conventional resin modified with a polymerization initiator polymer in accordance with the preferred embodiments of the present invention and conventional PCB fabrication techniques (step 340). For example, a conventional resin (e.g., polyphenylene ether (PPE) resins, a modified PPE (APPE) resins, FR4 epoxy resins, bismaleimide triazine (BT) resins, polyphenylene oxide/triallyl-isocyanurate (PPO/TAIC) interpenetrating networks, and the like) may be modified to include a polymerization initiator polymer having a backbone with a free radical initiator forming segment that breaks apart upon being subjected to heat to generate a plurality of non-volatile initiating species. This modified resin may be applied to the coated substrate using any suitable conventional methodology known to those skilled in the art. After which the laminate is subjected to curing conditions, e.g., heated under vacuum, as known in the art, which results in a crosslinked phase that is covalently bound to the glass fibers to define a laminate, or laminated PCB.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. An enhanced prepreg for a printed circuit board (PCB), comprising:

a substrate; and a resin on the surface presented by the substrate, wherein the resin comprises a curable polymer and a polymerization initiator polymer having a backbone with a free radical initiator forming segment that breaks apart upon being subjected to heat to generate a plurality of non-volatile initiating species, wherein the polymerization initiator polymer is

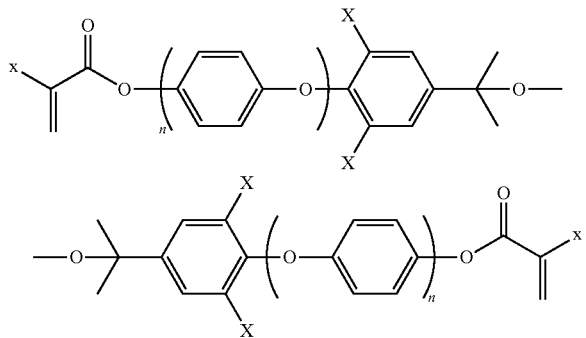

and wherein the non-volatile initiating species generated are

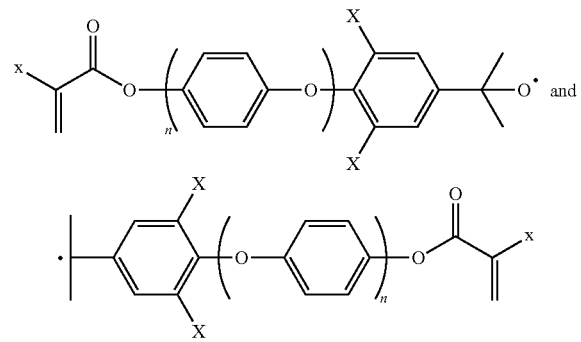

wherein X is a hydrogen atom or methyl group, and wherein x is a hydrogen atom or methyl group.

2. The enhanced prepreg as recited in claim 1, wherein the substrate comprises a sheet of woven glass fibers.

3. The enhanced prepreg as recited in claim 2, wherein the surface presented by the substrate includes a silane coupling agent, and wherein the silane coupling agent couples the resin to the substrate.

4. The enhanced prepreg as recited in claim 1, wherein the substrate comprises copper, and wherein the enhanced prepreg is resin coated copper (RCC).

5. A method of making the enhanced prepreg according to claim 1, comprising the steps of:

providing the substrate;

applying the resin to the surface presented by the substrate; and curing the resin by subjecting the substrate and the resin to heat sufficient to break the free radical initiator forming segment of the polymer backbone to generate the non-volatile initiating species.

6. An enhanced prepreg for a printed circuit board (PCB), comprising:
a substrate; and
a resin on the surface presented by the substrate, wherein the resin comprises a curable polymer and a polymerization initiator polymer having a backbone with a free radical initiator forming segment that breaks apart upon being subjected to heat to generate a plurality of non-volatile initiating species, wherein the polymerization initiator polymer is

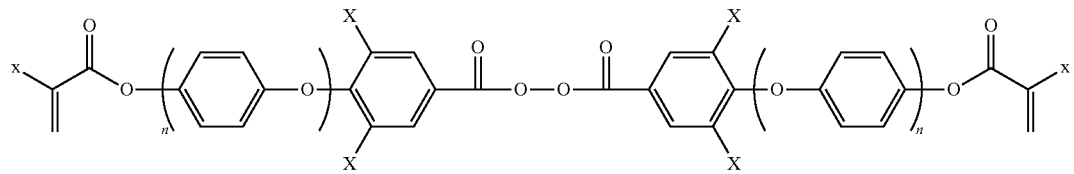

and wherein the non-volatile initiating species generated are

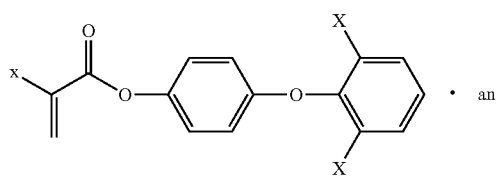 and

-continued

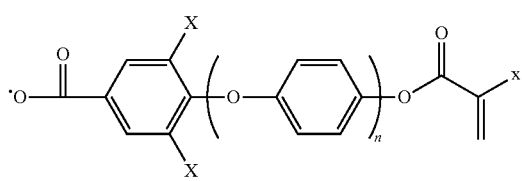

wherein X is a hydrogen atom or methyl group, and wherein x is a hydrogen atom or methyl group.

7. The enhanced prepreg as recited in claim 6, wherein the substrate comprises a sheet of woven glass fibers.

8. The enhanced prepreg as recited in claim 7, wherein the surface presented by the substrate includes a silane coupling agent, and wherein the silane coupling agent couples the resin to the substrate.

9. The enhanced prepreg as recited in claim 6, wherein the substrate comprises copper, and wherein the enhanced prepreg is resin coated copper (RCC).

10. A method of making the enhanced prepreg according to claim 6, comprising the steps of:
providing the substrate;
applying the resin to the surface presented by the substrate; and
curing the resin by subjecting the substrate and the resin to heat sufficient to break the free radical initiator forming segment of the polymer backbone to generate the non-volatile initiating species.

11. An enhanced prepreg for a printed circuit board (PCB), comprising:
a substrate; and
a resin on the surface presented by the substrate, wherein the resin comprises a curable polymer and a polymerization initiator polymer having a backbone with a free radical initiator forming segment that breaks apart upon being subjected to heat to generate a plurality of non-volatile initiating species, wherein the polymerization initiator polymer is

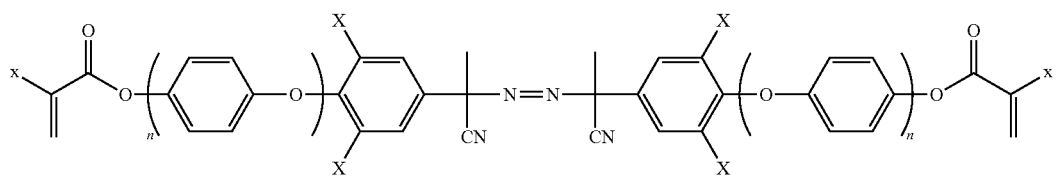

and wherein the non-volatile initiating species generated are

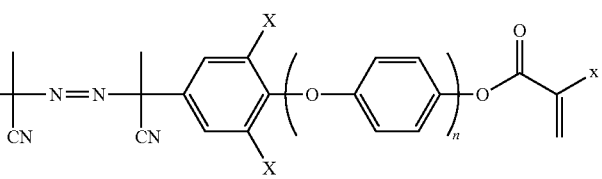 and

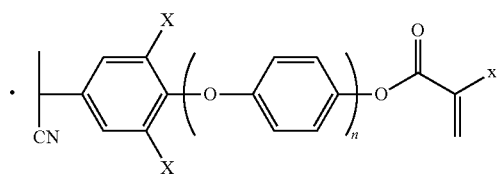

wherein X is a hydrogen atom or methyl group, and wherein x is a hydrogen atom or methyl group.

12. The enhanced prepreg as recited in claim 11, wherein the substrate comprises a sheet of woven glass fibers.

13. The enhanced prepreg as recited in claim 12, wherein the surface presented by the substrate includes a silane coupling agent, and wherein the silane coupling agent couples the resin to the substrate.

14. The enhanced prepreg as recited in claim 11, wherein the substrate comprises copper, and wherein the enhanced prepreg is resin coated copper (RCC).

15. A method of making the enhanced prepreg according to claim 11, comprising the steps of:
   providing the substrate;
   applying the resin to the surface presented by the substrate; and
   curing the resin by subjecting the substrate and the resin to heat sufficient to break the free radical initiator forming segment of the polymer backbone to generate the non-volatile initiating species.

\* \* \* \* \*